United States Patent
Wang et al.

(10) Patent No.: US 11,199,565 B1
(45) Date of Patent: Dec. 14, 2021

(54) UNDERVOLTAGE DETECTION CIRCUIT

(71) Applicant: NOVATEK MICROELECTRONICS CORP., Hsinchu Science Park (TW)

(72) Inventors: Ying-Hsiang Wang, New Taipei (TW); Jung-Hsing Liao, Hsinchu (TW)

(73) Assignee: NOVATEK MICROELECTRONICS CORP., Hsinchu Science Park (TW)

( * ) Notice: Subject to any disclaimer, the term of this patent is extended or adjusted under 35 U.S.C. 154(b) by 31 days.

(21) Appl. No.: 16/932,563

(22) Filed: Jul. 17, 2020

(51) Int. Cl.
| | |
|---|---|
| H03K 5/22 | (2006.01) |
| G01R 19/165 | (2006.01) |
| G05F 1/56 | (2006.01) |
| G06F 1/28 | (2006.01) |
| G01R 15/04 | (2006.01) |
| G05F 3/26 | (2006.01) |
| H02H 3/24 | (2006.01) |
| H03K 5/24 | (2006.01) |

(52) U.S. Cl.
CPC ....... *G01R 19/16552* (2013.01); *G01R 15/04* (2013.01); *G01R 19/16528* (2013.01); *G05F 1/561* (2013.01); *G05F 3/262* (2013.01); *G06F 1/28* (2013.01); *H02H 3/243* (2013.01); *H03K 5/24* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,109,761 | B2* | 9/2006 | Isomura | H03K 5/2481 |
| | | | | 327/77 |
| 8,638,127 | B2* | 1/2014 | Zeng | G01R 19/16576 |
| | | | | 327/77 |

FOREIGN PATENT DOCUMENTS

| | | |
|---|---|---|
| EP | 0 733 959 A1 | 9/1996 |
| TW | 201003081 A | 1/2010 |
| TW | 201137366 A | 11/2011 |

OTHER PUBLICATIONS

Search Report appended to an Office Action, which was issued to Taiwanese counterpart Application No. 109130225 by the TIPO dated May 26, 2021 with an English translation thereof (2 pages).

* cited by examiner

*Primary Examiner* — Long Nguyen
(74) *Attorney, Agent, or Firm* — Hamre, Schumann, Mueller & Larson, P.C.

(57) ABSTRACT

An undervoltage detection circuit includes a voltage divider, a voltage-to-current (V-to-I) converter and a current comparator. The voltage divider divides a supply voltage to generate a divided voltage. The V-to-I converter converts the divided voltage into a first current based on a first V-to-I transfer function, and converts the divided voltage into a second current based on a second V-to-I transfer function different from the first V-to-I transfer function. The current comparator compares the first and second currents to generate a comparison signal that indicates whether the supply voltage is sufficiently large.

9 Claims, 7 Drawing Sheets

UNDERVOLTAGE DETECTION CIRCUIT

FIELD

The disclosure relates to voltage detection, and more particularly to an undervoltage detection circuit.

BACKGROUND

An undervoltage detection circuit is used in a chip to detect whether a supply voltage to the chip is sufficiently large. When the supply voltage is determined to be not sufficiently large, other circuits of the chip are locked out to avoid function errors and short circuit currents. It is important that the undervoltage detection circuit exhibits little dependence on process and temperature variations.

A conventional undervoltage detection circuit includes a bandgap circuit and a comparator. The bandgap circuit generates a bandgap voltage that is independent of process and temperature variations. The comparator compares the bandgap voltage and a voltage derived from the supply voltage to determine whether the supply voltage is sufficiently large. The bandgap circuit works when the supply voltage is greater than a large start-up threshold, so the conventional undervoltage detection circuit disadvantageously has a large undefined region (i.e., a range of the supply voltage over which the undervoltage detection circuit cannot properly provide an output).

SUMMARY

Therefore, an object of the disclosure is to provide an undervoltage detection circuit that exhibits little dependence on process and temperature variations when voltage-to-current (V-to-I) transfer functions thereof are properly designed.

According to the disclosure, the undervoltage detection circuit includes a voltage divider, a V-to-I converter and a current comparator. The voltage divider is to receive a supply voltage, and divides the supply voltage to generate a divided voltage. The V-to-I converter is coupled to the voltage divider to receive the divided voltage therefrom, and converts the divided voltage into a first current based on a first V-to-I transfer function, and converts the divided voltage into a second current based on a second V-to-I transfer function different from the first V-to-I transfer function. The current comparator is coupled to the V-to-I converter to receive the first and second currents therefrom, and compares the first and second currents to generate a comparison signal that indicates whether the supply voltage is sufficiently large.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
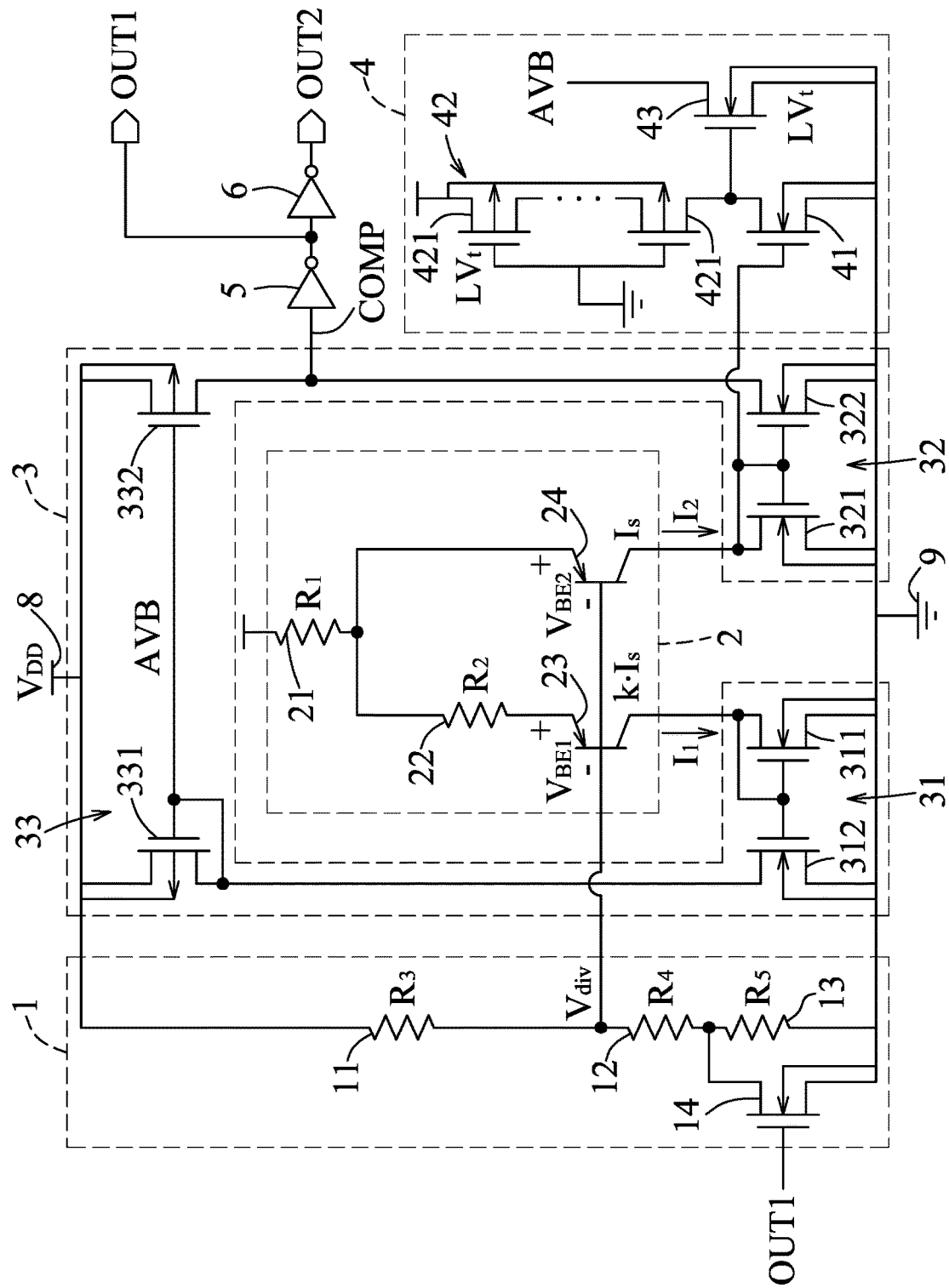
FIG. 1 is a circuit diagram illustrating a first embodiment of an undervoltage detection circuit according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a first embodiment of an undervoltage detection circuit according to the disclosure includes a voltage divider 1, a voltage-to-current (V-to-I) converter 2, a current comparator 3, an undefined region limiter 4 and two inverters 5, 6.

The voltage divider 1 is to receive a supply voltage ($V_{DD}$), and divides the supply voltage ($V_{DD}$) to generate a divided voltage ($V_{div}$).

The V-to-I converter 2 is coupled to the voltage divider 1 to receive the divided voltage ($V_{div}$) therefrom, and converts the divided voltage ($V_{div}$) into a first current ($I_1$) based on a first V-to-I transfer function, and converts the divided voltage ($V_{div}$) into a second current ($I_2$) based on a second V-to-I transfer function different from the first V-to-I transfer function.

The current comparator 3 is coupled to the V-to-I converter 2 to receive the first and second currents ($I_1$, $I_2$) therefrom, and compares the first and second currents ($I_1$, $I_2$) to generate a comparison signal (COMP) that indicates whether the supply voltage ($V_{DD}$) is sufficiently large.

The undefined region limiter 4 is coupled to the current comparator 3. When the supply voltage ($V_{DD}$) is below a range over which the current comparator 3 can properly provide the comparison signal (COMP), the undefined region limiter 4 causes the comparison signal (COMP) to indicate that the supply voltage ($V_{DD}$) is not sufficiently large.

The inverter 5 has an input terminal that is coupled to the current comparator 3 to receive the comparison signal (COMP) therefrom, and an output terminal that provides an output signal (OUT1) complementary to the comparison signal (COMP).

The inverter 6 has an input terminal that is coupled to the output terminal of the inverter 5 to receive the output signal (OUT1) therefrom, and an output terminal that provides an output signal (OUT2) complementary to the output signal (OUT1).

In this embodiment, a ratio of the divided voltage to the supply voltage (i.e., $V_{div}/V_{DD}$) is variable according to the comparison signal (COMP), and the voltage divider 1 includes three resistors 11-13 and a switch 14. The resistor 11 has a first terminal that is coupled to a first power rail 8 to receive the supply voltage ($V_{DD}$) therefrom, a second terminal, and a resistance of $R_3$. The resistor 12 has a first terminal that is coupled to the second terminal of the resistor 11, a second terminal, and a resistance of $R_4$. The resistor 13 has a first terminal that is coupled to the second terminal of the resistor 12, a second terminal that is coupled to a second power rail 9 to receive a ground voltage therefrom, and a resistance of $R_5$. The switch 14 (e.g., an N-type metal oxide semiconductor field effect transistor (nMOSFET)) is coupled to the resistor 13 in parallel, and has a control terminal (e.g., a gate terminal) that is coupled to the output terminal of the inverter 5 to receive the output signal (OUT1) therefrom. The divided voltage ($V_{div}$) is provided at a common node of the resistors 11, 12. When the comparison signal (COMP) is in a logic "0" state, the switch 14 conducts, and the ratio ($V_{div}/V_{DD}$) is equal to $R_4/(R_3+R_4)$. When the comparison signal (COMP) is in a logic "1" state, the switch 14 does not conduct, and the ratio ($V_{div}/V_{DD}$) is equal to $(R_4+R_5)/(R_3+R_4+R_5)$.

In this embodiment, the V-to-I converter 2 includes two resistors 21, 22, and two PNP bipolar junction transistors (BJTs) 23, 24. The resistor 21 has a first terminal that is coupled to the first power rail 8 to receive the supply voltage ($V_{DD}$) therefrom, a second terminal, and a resistance of $R_1$. The resistor 22 has a first terminal that is coupled to the second terminal of the resistor 21, a second terminal, and a resistance of $R_2$. The PNP BJT 23 has an emitter terminal that is coupled to the second terminal of the resistor 22, a collector terminal that provides the first current ($I_1$), and a base terminal that is coupled to the common node of the resistors 11, 12 to receive the divided voltage ($V_{div}$) therefrom. The PNP BJT 24 has an emitter terminal that is coupled to the second terminal of the resistor 21, a collector terminal that provides the second current ($I_2$), and a base terminal that is coupled to the common node of the resistors 11, 12 to receive the divided voltage ($V_{div}$) therefrom. The PNP BJT 24 has a saturation current of $I_s$, and the PNP BJT 23 has a saturation current of $k \cdot I_s$, where k>1. In other words, the saturation current of the PNP BJT 24 is smaller than the saturation current of the PNP BJT 23.

In this embodiment, the current comparator 3 includes three current mirrors 31-33. The current mirror 31 has an input terminal that is coupled to the collector terminal of the PNP BJT 23 to receive the first current ($I_1$) therefrom, and an output terminal. The current mirror 32 has an input terminal that is coupled to the collector terminal of the PNP BJT 24 to receive the second current ($I_2$) therefrom, and an output terminal. The current mirror 33 has an input terminal that is coupled to the output terminal of the current mirror 31, and an output terminal that is coupled to the output terminal of the current mirror 32. The comparison signal (COMP) is provided at a common node of the current mirrors 32, 33. Each of the current mirrors 31, 32 includes two nMOSFETs 311/321, 312/322. The current mirror 33 includes two P-type metal oxide semiconductor field effect transistors (pMOSFETs) 331, 332. The MOSFETs 311-332 of the current mirrors 31-33 are sized in such a way that: (a) when $n_1 \cdot I_1 > n_2 \cdot I_2$, the comparison signal (COMP) is in the logic "1" state (i.e., a voltage thereof is equal to the supply voltage ($V_{DD}$)); and (b) when $n_1 \cdot I_1 < n_2 \cdot I_2$, the comparison signal (COMP) is in the logic "0" state (i.e., the voltage thereof is equal to the ground voltage), where $n_1$ and $n_2$ are constants that may be the same or different.

In this embodiment, the undefined region limiter 4 includes two nMOSFET 41, 43 and a resistive element 42. The nMOSFET 41 has a drain terminal, a source terminal that is coupled to the second power rail 9 to receive the ground voltage therefrom, and a gate terminal that is coupled to a gate terminal of the nMOSFET 321. The nMOSFET 41 generates a current that is a mirror of the second current ($I_2$). The resistive element 42 has a first terminal that is coupled to the first power rail 8 to receive the supply voltage ($V_{DD}$) therefrom, and a second terminal that is coupled to the drain terminal of the nMOSFET 41. The resistive element 42 includes a plurality of pMOSFETs 421, each of which is a low threshold voltage (LVt) MOSFET, which are coupled in series between the first and second terminals of the resistive element 42, and each of which has a gate terminal that is coupled to the second power rail 9 to receive the ground voltage therefrom. The nMOSFET 43 is an LVt MOSFET, and has a drain terminal that is coupled to a gate terminal of the pMOSFET 332, a source terminal that is coupled to the source terminal of the nMOSFET 41, and a gate terminal that is coupled to the drain terminal of the nMOSFET 41. When the nMOSFET 43 conducts, the pMOSFET 332 conducts as well to cause the comparison signal (COMP) to be in the logic "1" state.

Figure 2:
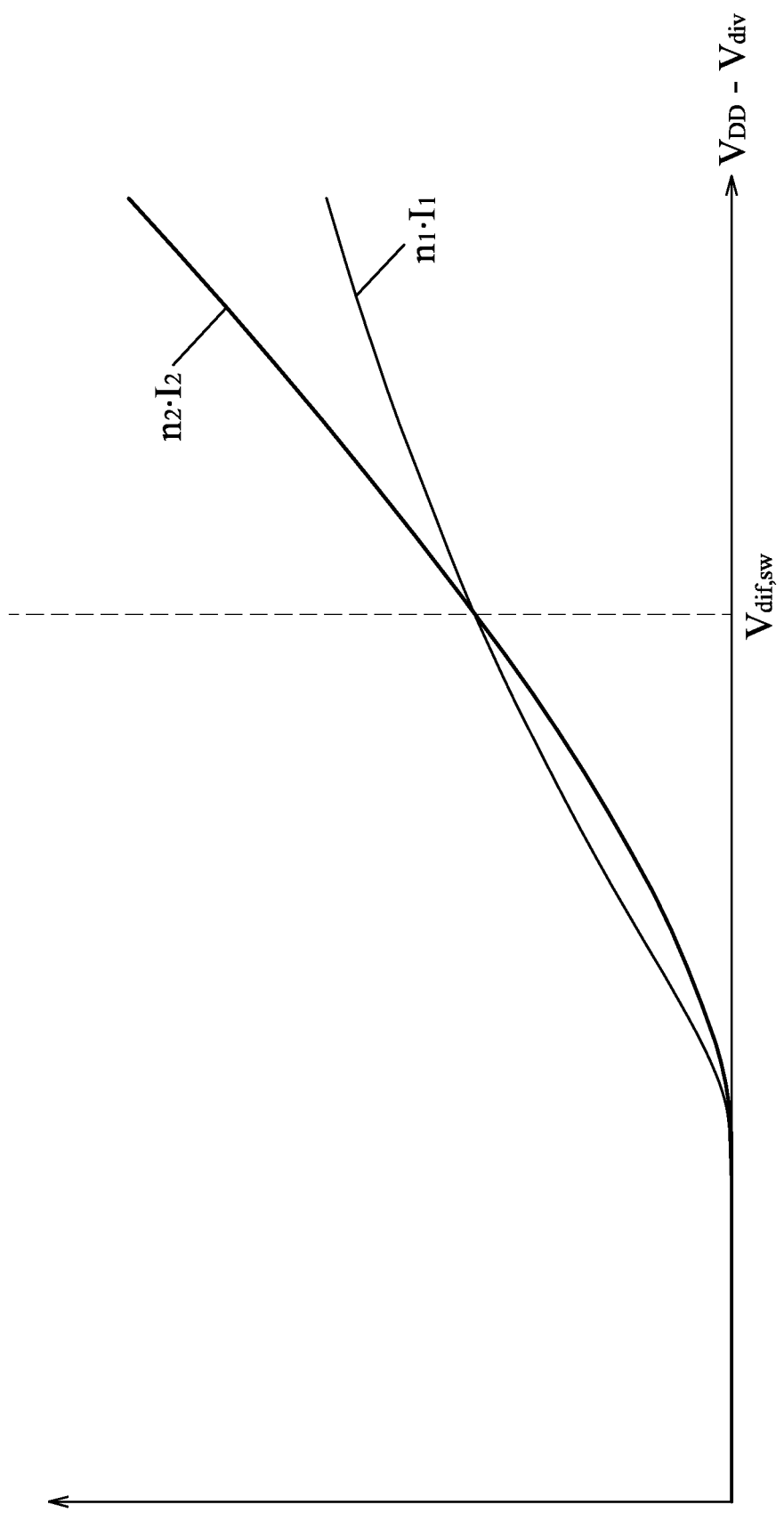
FIG. 2 is a plot illustrating a first voltage-to-current transfer function and a second voltage-to-current transfer function of the first embodiment.

FIG. 2 illustrates the first and second V-to-I transfer functions. Referring to FIGS. 1 and 2, when a voltage across the resistors 21, 22 and a base-emitter junction of the PNP BJT 23 (or a voltage across the resistor 21 and a base-emitter junction of the PNP BJT 24) (i.e., $V_{DD}-V_{div}$) is smaller than a corresponding switching threshold ($V_{dif,sw}$), $n_1 \cdot I_1 > n_2 \cdot I_2$, and the comparison signal (COMP) is in the logic "1" state to indicate that the supply voltage ($V_{DD}$) is not sufficiently large. When the voltage ($V_{DD}-V_{div}$) is equal to the switching threshold ($V_{dif,sw}$), $n_1 \cdot I_1 = n_2 I_2$. When the voltage ($V_{DD}-V_{div}$) is greater than the switching threshold ($V_{dif,sw}$), $n_1 \cdot I_1 < n_2 I_2$, and the comparison signal (COMP) is in the logic "0" state to indicate that the supply voltage ($V_{DD}$) is sufficiently large. Therefore, in operation, the comparison signal (COMP) switches when the voltage ($V_{LDD}-V_{div}$) is equal to the switching threshold ($V_{dif,sw}$).

The first and second currents ($I_1$, $I_2$) can be respectively expressed by the following equations:

$$I_1 = k \cdot I_s \cdot \exp\left(\frac{V_{BE1}}{V_T}\right), \quad \text{and} \qquad \text{Equation 1}$$

$$I_2 = I_s \cdot \exp\left(\frac{V_{BE2}}{V_T}\right), \qquad \text{Equation 2}$$

where $V_{BE1}$ denotes a voltage across the base-emitter junction of the PNP BJT 23, $V_{BE2}$ denotes a voltage across the base-emitter junction of the PNP BJT 24, and $V_T$ denotes a thermal voltage.

In addition, the first current ($I_1$) can be expressed by the following equation:

$$I_1 = \frac{V_{BE2} - V_{BE1}}{R_2}. \qquad \text{Equation 3}$$

Based on Equations 1-3, the switching threshold ($V_{dim,sw}$) can be derived as follows.

$$\begin{aligned}
V_{dif,sw} &= V_{BE2} + (I_1 + I_2) \cdot R_1 \\
&= V_{BE2} + \left(1 + \frac{n_1}{n_2}\right) \cdot I_1 \cdot R_1 \\
&= V_{BE2} + \left(1 + \frac{n_1}{n_2}\right) \cdot \frac{R_1}{R_2} \cdot (V_{BE2} - V_{BE1}) \\
&= V_{BE2} + \left(1 + \frac{n_1}{n_2}\right) \cdot \frac{R_1}{R_2} \cdot \left(V_T \cdot \ln\frac{I_2}{I_s} - V_T \cdot \ln\frac{I_1}{k \cdot I_s}\right)
\end{aligned}$$

$$= V_{BE2} + \left(1 + \frac{n_1}{n_2}\right) \cdot \frac{R_1}{R_2} \cdot V_T \cdot \ln\left(\frac{n_1}{n_2} \cdot k\right)$$

The voltage ($V_{BE2}$) has a temperature coefficient of about −1.5 mV/° K. The thermal voltage ($V_T$) has a temperature coefficient of about 0.087 mV/° K. By properly choosing the parameters (k, $n_1$, $n_2$, $R_1$, $R_2$), the switching threshold ($V_{dif,sw}$) can have a zero temperature coefficient.

Figure 3:
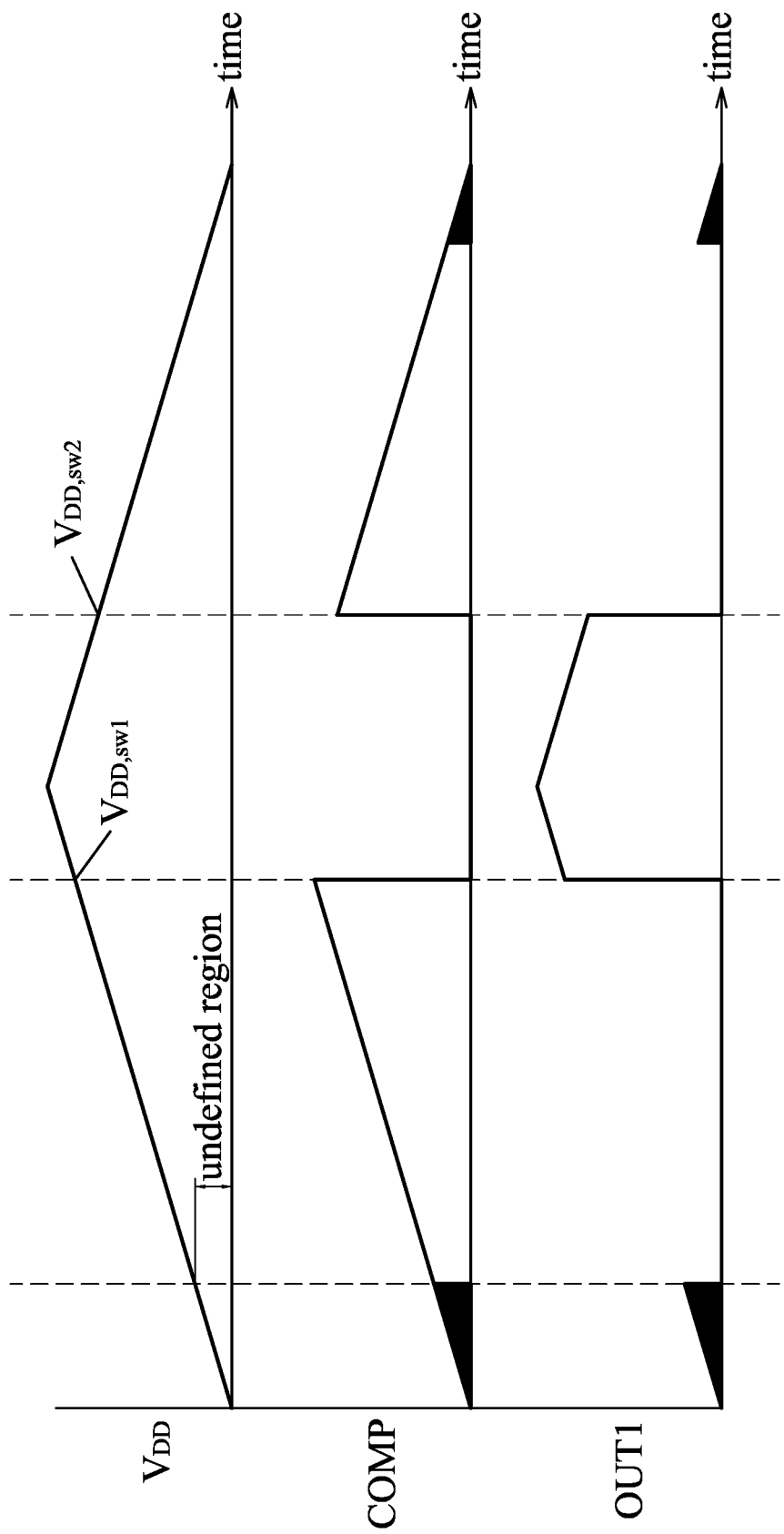
FIG. 3 is a timing diagram illustrating a supply voltage, a comparison signal and an output signal of the first embodiment.

Referring to FIGS. 1 and 3, when the supply voltage ($V_{DD}$) increases gradually while the current comparator 3 properly provides the comparison signal (COMP), the undervoltage detection circuit of this embodiment operates as follows. Initially, the comparison signal (COMP) is in the logic "1" state, the switch 14 does not conduct, and the divided voltage ($V_{div}$) is equal to $$\frac{R_4 + R_5}{R_3 + R_4 + R_5} \cdot V_{DD}.$$

Thereafter, the comparison signal (COMP) switches to the logic "0" state when the supply voltage ($V_{DD}$) is equal to a corresponding switching threshold ($V_{DD,sw1}$) of $$\frac{R_3 + R_4 + R_5}{R_3} \cdot V_{dif,sw}.$$

When the supply voltage ($V_{DD}$) decreases gradually while the current comparator 3 properly provides the comparison signal (COMP), the undervoltage detection circuit of this embodiment operates as follows. Initially, the comparison signal (COMP) is in the logic "0" state, the switch 14 conducts, and the divided voltage ($V_{div}$) is equal to $$\frac{R_4}{R_3 + R_4} \cdot V_{DD}.$$

Thereafter, the comparison signal (COMP) switches to the logic "1" state when the supply voltage ($V_{DD}$) is equal to a corresponding switching threshold ($V_{DD,sw2}$) of $$\frac{R_3 + R_4}{R_3} \cdot V_{dif,sw}.$$

The switching threshold ($V_{DD,sw2}$) is different from the switching threshold ($V_{DD,sw1}$). Therefore, the undervoltage detection circuit of this embodiment has hysteresis.

In an example where the undefined region limiter 4 is omitted, a lower limit of the range over which the current comparator 3 can properly provide the comparison signal (COMP) is determined by a voltage between a gate terminal and a source terminal of the pMOSFET 331 and a voltage between a drain terminal and a source terminal of the nMOSFET 312, and is about 0.7V-0.8V. Therefore, an upper limit of an undefined region (i.e., a range of the supply voltage ($V_{DD}$) over which the undervoltage detection circuit cannot properly provide the output signals (OUT1, OUT2)) is about 0.8V. In this embodiment, when the supply voltage ($V_{DD}$) increases gradually, when the supply voltage ($V_{DD}$) is greater than a threshold voltage of the nMOSFET 43 and a threshold voltage of each pMOSFET 421, and when the supply voltage ($V_{DD}$) is smaller than the switching threshold ($V_{DD,sw1}$), the undefined region limiter 4 operates as follows. Initially, the nMOSFET 41 does not conduct, and the pMOSFETs 421 and the nMOSFET 43 conduct, so the pMOSFET 332 conducts to cause the comparison signal (COMP) to be in the logic "1" state. Thereafter, the second current ($I_2$) increases rapidly with increasing supply voltage ($V_{DD}$), so the nMOSFET 41 conducts, and the nMOSFET 43 does not conduct. Therefore, the upper limit of the undefined region is equal to a maximum of the threshold voltage of the nMOSFET 43 and the threshold voltage of each pMOSFET 421, which is about 0.4V-0.5V. The undefined region is reduced in this embodiment as compared to the aforesaid example.

Referring back to FIG. 1, it should be noted that, in other embodiments, the following modifications may be made to this embodiment.

1. The resistive element 42 is implemented by active devices other than pMOSFETs, or by passive devices (e.g., resistors).

Figure 4:
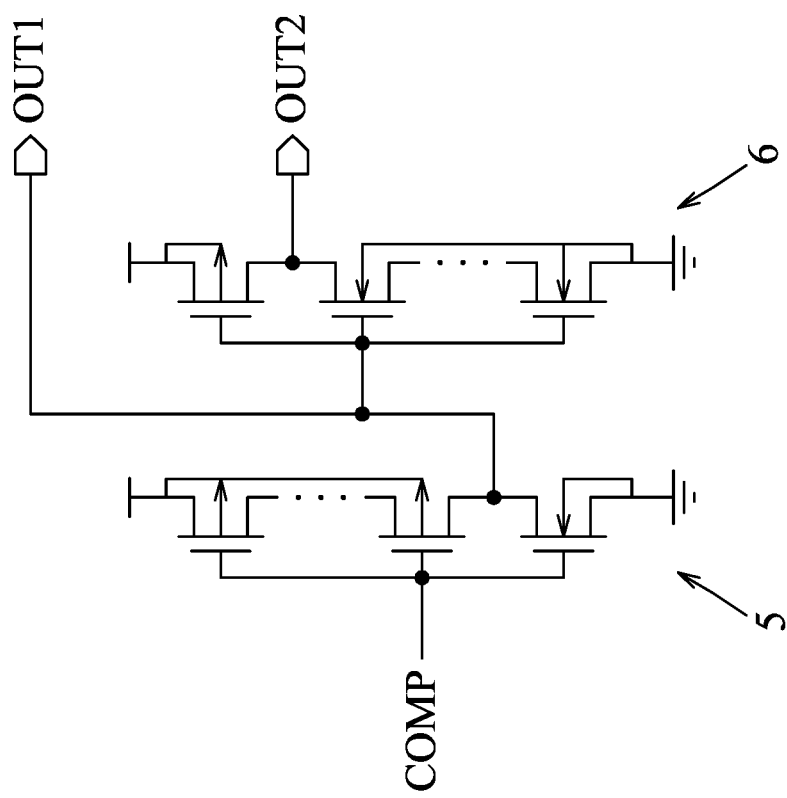
FIG. 4 is a circuit diagram illustrating a modification of the first embodiment.

2. As shown in FIG. 4, the inverter 5 is a low skew inverter, and the inverter 6 is a high skew inverter, thereby further reducing the undefined region.

3. The undefined region limiter 4 is omitted, the inverter 5 is a low skew inverter, and the inverter 6 is a high skew inverter.

In view of the above, the undervoltage detection circuit of this embodiment has the following advantages.

1. By designing the first and second V-to-I transfer functions in such a way that the switching threshold ($V_{dif,sw}$) has a zero temperature coefficient, the undervoltage detection circuit can exhibit little dependence on process and temperature variations.

2. By virtue of the undefined region limiter 4 causing the comparison signal (COMP) to indicate that the supply voltage ($V_{DD}$) is not sufficiently large when the supply voltage ($V_{DD}$) is below the range over which the current comparator 3 can properly provide the comparison signal (COMP), the undefined region can be reduced.

Figure 5:
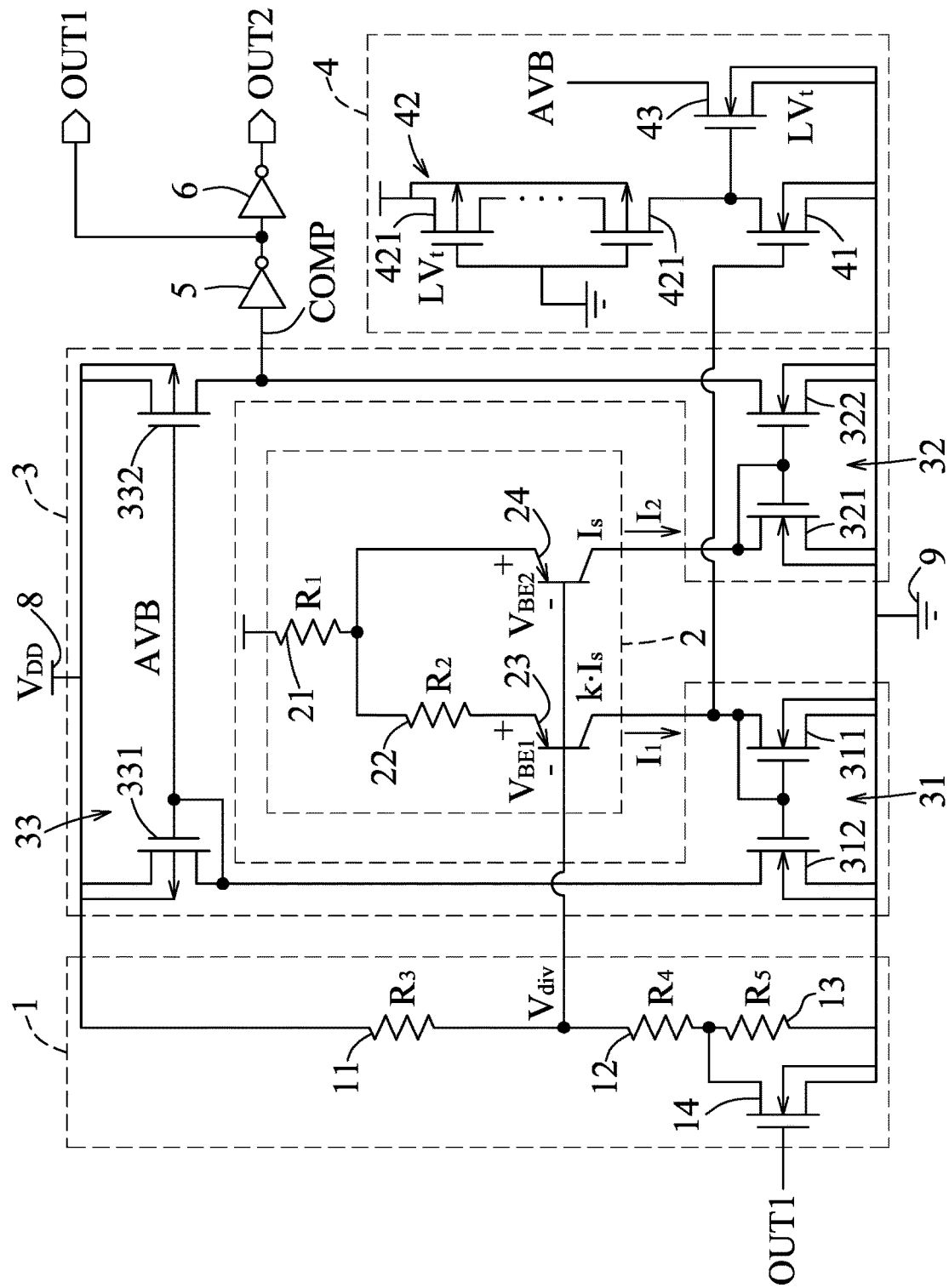
FIG. 5 is a circuit diagram illustrating a second embodiment of the undervoltage detection circuit according to the disclosure.

Referring to FIG. 5, a second embodiment of the undervoltage detection circuit according to the disclosure is similar to the first embodiment, and differs from the first embodiment in that the gate terminal of the nMOSFET 41 is coupled to a gate terminal of the nMOSFET 311 instead of to the gate terminal of the nMOSFET 321. Therefore, in the second embodiment, the current generated by the nMOSFET 41 is a mirror of the first current ($I_1$).

Figure 6:
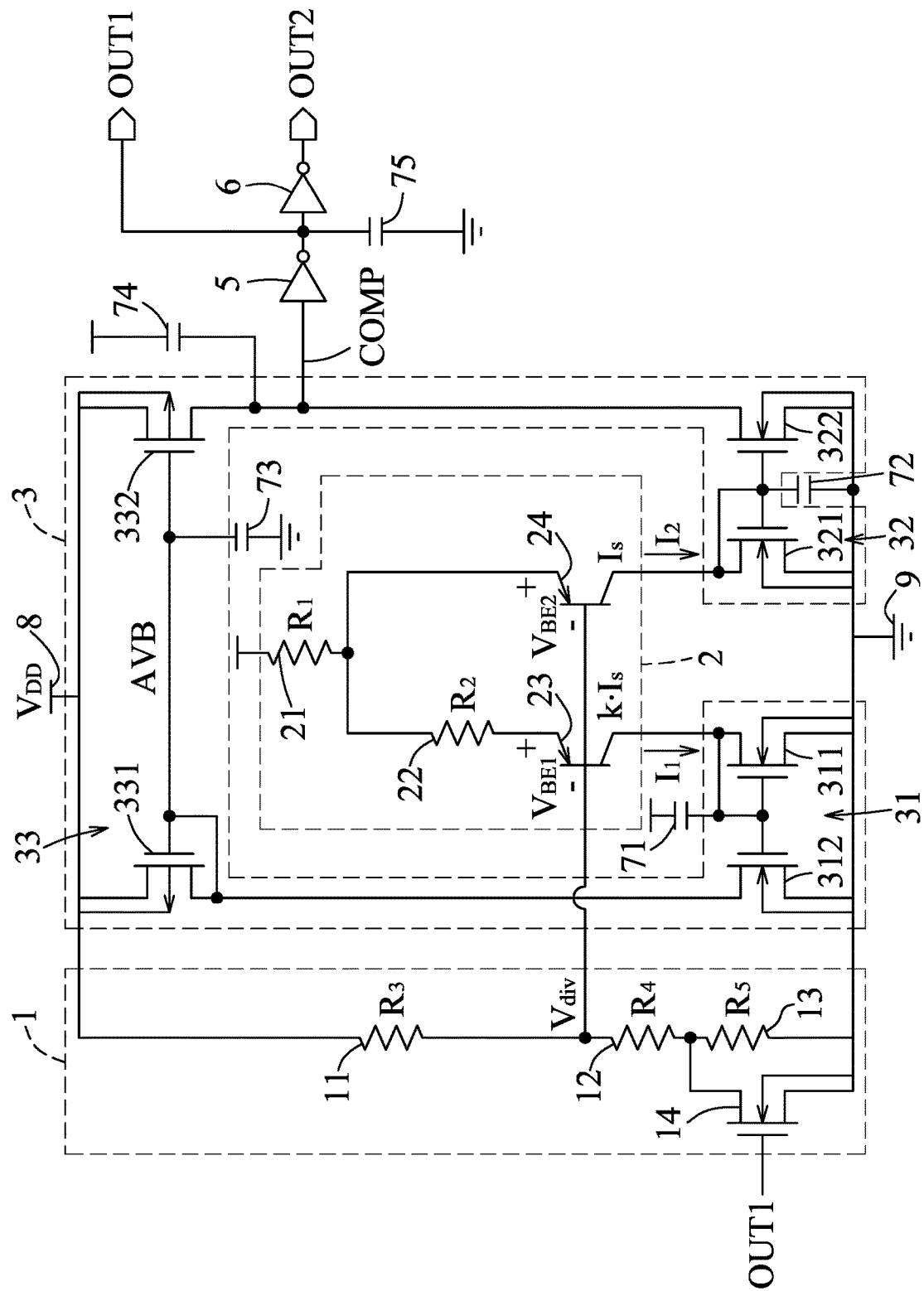
FIG. 6 is a circuit diagram illustrating a third embodiment of the undervoltage detection circuit according to the disclosure.

Referring to FIG. 6, a third embodiment of the undervoltage detection circuit according to the disclosure is similar to the first embodiment, and differs from the first embodiment in that: (a) the undefined region limiter 4 (see FIG. 1) is omitted; and (b) the undervoltage detection circuit further includes five capacitors 71-75.

In the third embodiment, each of the capacitors 71-75 has a first terminal and a second terminal. The first terminal of the capacitor 71 is coupled to the first power rail 8 to receive the supply voltage ($V_{DD}$) therefrom. The second terminal of the capacitor 71 is coupled to a gate terminal of the nMOSFET 312. The first terminal of the capacitor 72 is coupled to a gate terminal of the nMOSFET 322. The second terminal of the capacitor 72 is coupled to the second power rail 9 to receive the ground voltage therefrom. The first terminal of the capacitor 73 is coupled to the gate terminal of the pMOSFET 332. The second terminal of the capacitor 73 is coupled to the second power rail 9 to receive the ground voltage therefrom. The first terminal of the capacitor 74 is coupled to the first power rail 8 to receive the supply voltage ($V_{DD}$) therefrom. The second terminal of the capacitor 74 is coupled to the common node of the second and third current mirrors 32, 33. The first terminal of the capacitor 75 is coupled to the output terminal of the inverter 5. The second terminal of the capacitor 75 is coupled to the second power rail 9 to receive the ground voltage therefrom. When the supply voltage ($V_{DD}$) is below the range over which the current comparator 3 can properly provide the comparison signal (COMP), the capacitors 71-75 cooperatively cause the comparison signal (COMP), the output signal (OUT1) and the output signal (OUT2) to be respectively in the logic "1" state, the logic "0" state and the logic "1" state, thereby reducing the undefined region. It should be noted that, in other embodiments, some of the capacitors 71-75 can be omitted.

Figure 7:
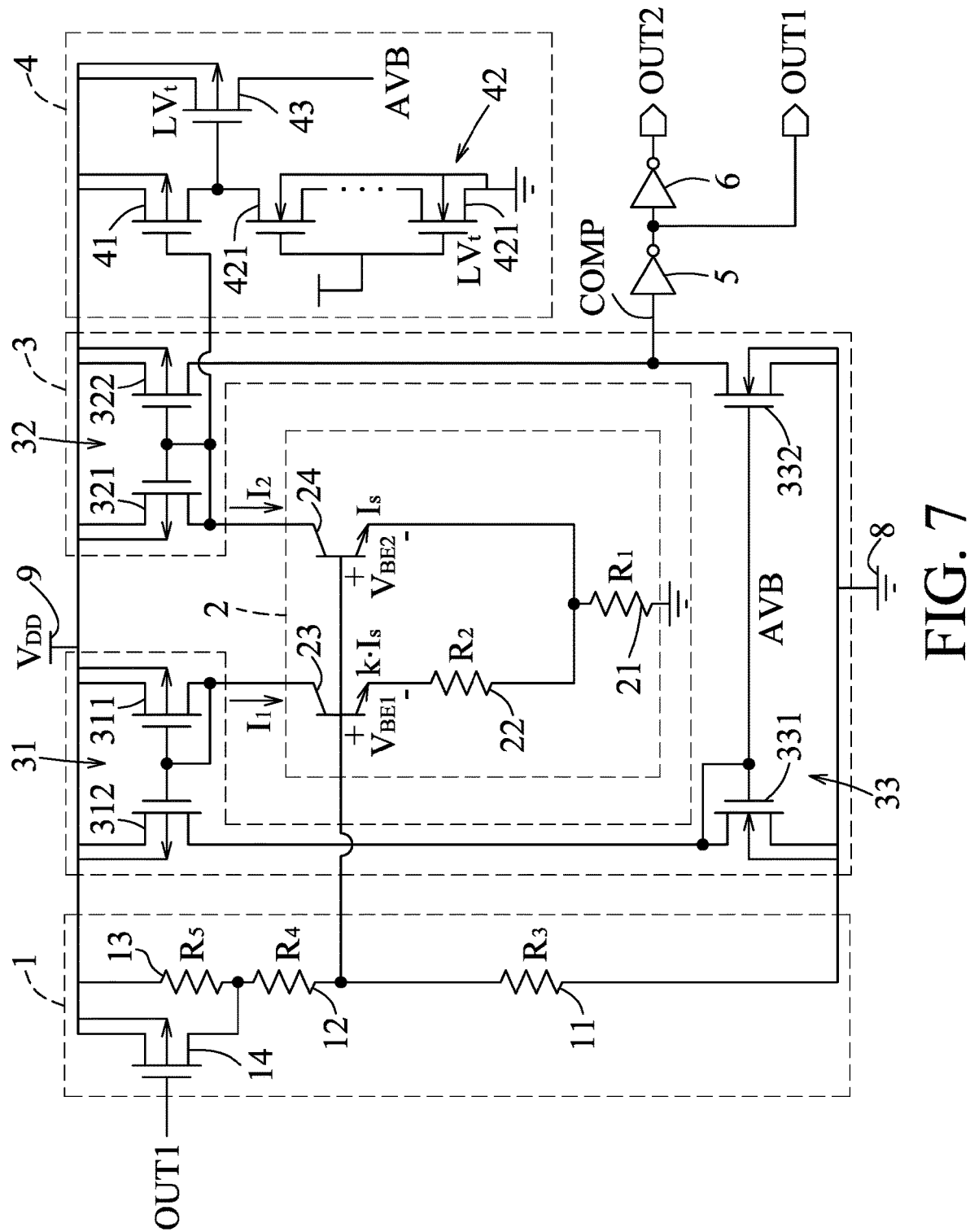
FIG. 7 is a circuit diagram illustrating a fourth embodiment of the undervoltage detection circuit according to the disclosure.

Referring to FIG. 7, a fourth embodiment of the undervoltage detection circuit according to the disclosure is similar to the first embodiment, and differs from the first embodiment in that: (a) the first power rail 8 transmits the ground voltage instead of the supply voltage ($V_{DD}$); (b) the second power rail 9 transmits the supply voltage ($V_{DD}$) instead of the ground voltage; (c) the BJTs 23, 24 are NPN BJTs instead of PNP BJTs; (d) the switch 14 and the MOSFETs 311, 312, 321, 322, 41, 43 are pMOSFETs instead of nMOSFETs; and (e) the MOSFETs 331, 332, 421 are nMOSFETs instead of pMOSFETs. Therefore, in the fourth embodiment, when $n_1 \cdot I_1 > n_2 \cdot I_2$, the comparison signal (COMP) is in the logic "0" state to indicate that the supply voltage ($V_{DD}$) is not sufficiently large, and the switch 14 does not conduct; and when $n_1 \cdot I_1 < n_2 I_2$, the comparison signal (COMP) is in the logic "1" state to indicate that the supply voltage ($V_{DD}$) is sufficiently large, and the switch 14 conducts.

It should be noted that the modifications which are made to the first embodiment to obtain the fourth embodiment can also be made to each of the second and third embodiments.

It should also be noted that, in other embodiments, the following modifications may be made to the fourth embodiment.

1. The resistive element 42 is implemented by active devices other than the nMOSFETs 421, or by passive devices (e.g., resistors).

2. The inverter 5 is a high skew inverter, and the inverter 6 is a low skew inverter, thereby further reducing the undefined region.

3. The undefined region limiter 4 is omitted, the inverter 5 is a high skew inverter, and the inverter 6 is a low skew inverter.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that the disclosure is not limited to the disclosed embodiments but is intended to cover various arrangements included within the spirit and scope of the broadest interpretation so as to encompass all such modifications and equivalent arrangements.

What is claimed is:

1. An undervoltage detection circuit comprising:
   a voltage divider to receive a supply voltage, and dividing the supply voltage to generate a divided voltage;
   a voltage-to-current (V-to-I) converter coupled to said voltage divider to receive the divided voltage therefrom, converting the divided voltage into a first current based on a first V-to-I transfer function, and converting the divided voltage into a second current based on a second V-to-I transfer function different from the first V-to-I transfer function; and
   a current comparator coupled to said V-to-I converter to receive the first and second currents therefrom, and comparing the first and second currents to generate a comparison signal that indicates whether the supply voltage is sufficiently large.

2. The undervoltage detection circuit of claim 1, wherein said V-to-I converter includes:
   a first resistor having a first terminal that is to receive one of the supply voltage and a ground voltage, and a second terminal;
   a second resistor having a first terminal that is coupled to said second terminal of said first resistor, and a second terminal;
   a first bipolar junction transistor (BJT) having an emitter terminal that is coupled to said second terminal of said second resistor, a collector terminal that is coupled to said current comparator and that provides the first current, and a base terminal that is coupled to said voltage divider to receive the divided voltage therefrom; and
   a second BJT having an emitter terminal that is coupled to said second terminal of said first resistor, a collector terminal that is coupled to said current comparator and that provides the second current, and a base terminal that is coupled to said voltage divider to receive the divided voltage therefrom;
   said second BJT having a saturation current smaller than that of said first BJT.

3. The undervoltage detection circuit of claim 1, wherein said current comparator includes:
   a first current mirror having an input terminal that is coupled to said V-to-I converter to receive the first current therefrom, and an output terminal;
   a second current mirror having an input terminal that is coupled to said V-to-I converter to receive the second current therefrom, and an output terminal; and
   a third current mirror having an input terminal that is coupled to said output terminal of said first current mirror, and an output terminal that is coupled to said output terminal of said second current mirror;
   the comparison signal being provided at a common node of said second and third current mirrors.

4. The undervoltage detection circuit of claim 1, wherein a ratio of the divided voltage to the supply voltage is variable according to the comparison signal.

5. The undervoltage detection circuit of claim 4, wherein said voltage divider includes:

a first resistor having a first terminal that is to receive one of the supply voltage and a ground voltage, and a second terminal that is coupled to said V-to-I converter;

a second resistor having a first terminal that is coupled to said second terminal of said first resistor, and a second terminal;

a third resistor having a first terminal that is coupled to said second terminal of said second resistor, and a second terminal that is to receive the other one of the supply voltage and the ground voltage; and a switch coupled to said third resistor in parallel, and having a control terminal that is to receive a signal related to the comparison signal; said switch conducting when the comparison signal indicates that the supply voltage is sufficiently large, and not conducting when the comparison signal indicates that the supply voltage is not sufficiently large;

the divided voltage being provided at a common node of said first and second resistors.

6. The undervoltage detection circuit of claim 1, further comprising an undefined region limiter that includes:

a first metal oxide semiconductor field effect transistor (MOSFET) having a drain terminal, a source terminal that is to receive one of the supply voltage and a ground voltage, and a gate terminal that is coupled to said current comparator; said first MOSFET generating a current that is a mirror of one of the first and second currents;

a resistive element having a first terminal that is to receive the other one of the supply voltage and the ground voltage, and a second terminal that is coupled to said drain terminal of said first MOSFET; and a second MOSFET being a low threshold voltage MOSFET, and having a drain terminal that is coupled to said current comparator, a source terminal that is coupled to said source terminal of said first MOSFET, and a gate terminal that is coupled to said drain terminal of said first MOSFET;

when said second MOSFET conducts, said current comparator causing the comparison signal to indicate that the supply voltage is not sufficiently large.

7. The undervoltage detection circuit of claim 6, wherein said resistive element includes:

a plurality of MOSFETs, each of which is a low threshold voltage MOSFET, which are coupled in series between said first and second terminals of said resistive element, and each of which has a gate terminal that is to receive said one of the supply voltage and the ground voltage.

8. The undervoltage detection circuit of claim 1, further comprising a capacitor that has a first terminal and a second terminal;

said first terminal of said capacitor being to receive one of the supply voltage and a ground voltage, which corresponds to that the supply voltage is not sufficiently large;

said second terminal of said capacitor being coupled to a node of said current comparator, at which the comparison signal is provided.

9. The undervoltage detection circuit of claim 1, further comprising:

a first inverter being one of a low skew inverter and a high skew inverter, and having an input terminal that is coupled to said current comparator to receive the comparison signal therefrom, and an output terminal; and a second inverter being the other one of the low skew inverter and the high skew inverter, and having an input terminal that is coupled to said output terminal of said first inverter, and an output terminal.

* * * * *